United States Patent
Rinehart et al.

[11] Patent Number: 5,900,683
[45] Date of Patent: May 4, 1999

[54] ISOLATED GATE DRIVER FOR POWER SWITCHING DEVICE AND METHOD FOR CARRYING OUT SAME

[75] Inventors: Lawrence Edward Rinehart, Milpitas, Calif.; Venkateswara Anand Sankaran, Dearborn, Mich.

[73] Assignees: Ford Global Technologies, Inc., Dearborn, Mich.; Semipower Systems, Inc., San Jose, Calif.

[21] Appl. No.: 08/997,198

[22] Filed: Dec. 23, 1997

[51] Int. Cl.$^6$ .................................................. H01H 35/00
[52] U.S. Cl. .............................................. 307/129; 307/126
[58] Field of Search .................................... 307/113, 125, 307/126, 129, 38; 363/40, 41; 361/35, 36, 18, 64, 115, 110, 113, 94–97, 119, 56–58; 327/304, 300, 432–492

[56] References Cited

U.S. PATENT DOCUMENTS

| | | | |
|---|---|---|---|
| 4,052,623 | 10/1977 | Loberg ..................................... | 307/251 |
| 4,322,785 | 3/1982 | Walker . | |
| 4,438,356 | 3/1984 | Fleischer ................................. | 307/571 |
| 4,461,966 | 7/1984 | Hebenstreit ............................. | 307/571 |
| 4,629,971 | 12/1986 | Kirk . | |
| 4,634,903 | 1/1987 | Montorfano ............................ | 307/571 |
| 4,751,397 | 6/1988 | Ide . | |
| 4,967,101 | 10/1990 | Nakamura et al. . | |
| 5,055,722 | 10/1991 | Latos et al. . | |
| 5,138,515 | 8/1992 | Bourgeois . | |
| 5,206,540 | 4/1993 | de Sa e Silva et al. . | |

*Primary Examiner*—Jeffrey Gaffin
*Assistant Examiner*—Ed Garlepp
*Attorney, Agent, or Firm*—Raymond L. Coppiellie; Roger L. May

[57] ABSTRACT

An isolated gate driver device for a power switching device having a plurality of transistors includes a primary circuit having a voltage source of a first voltage potential. The primary circuit constantly switches the voltage source to generate first and second load signals based on control signals received from a microcontroller. The first load signal is modulated at a first frequency for enabling the transistors, and the second load signal is modulated at a second frequency, different from the first frequency, for disabling the transistors. A plurality of high frequency transformers corresponding to each of the transistors is coupled to the primary circuit. The transformers have a primary side for receiving one of the first and second load signals and a secondary side for transforming the one of the first and second load signals into corresponding signals at a second voltage potential. A secondary circuit coupled between each of the transformers and each of the corresponding transistors provides a bias power supply to each of the transistors at the second voltage potential. The secondary circuit also enables and disables each of the transistors based on the first and second load signals.

18 Claims, 7 Drawing Sheets

5,900,683

ISOLATED GATE DRIVER FOR POWER SWITCHING DEVICE AND METHOD FOR CARRYING OUT SAME

TECHNICAL FIELD

This invention relates to isolated gate drivers for power switching devices and methods for carrying out same.

BACKGROUND ART

Many low voltage electronic circuits have a need to drive high voltage switching transistors through an isolating barrier. This need stems from the fact that a large voltage differential, typically in the order of 100 volts, exists between the low voltage control logic and the high voltage power switch. Therefore, for safety and other reasons, the control logic and high voltage switch must be electrically isolated.

Several circuits addressing these problems have been previously proposed. For example, circuits utilizing a number of low voltage power supplies coupled to the power switches, high-speed opto-couplers, or other extensive electrical isolation circuits have been proposed, although all have met with limited success due to problems associated with their excessive size and cost, or low reliability due to the large number of components.

One known circuit is described in U.S. Pat. No. 5,206,540 issued to de Sa e Silva et al (hereinafter referred to by '540). The '540 patent discloses a transformer isolated circuit for driving a semiconductor power switch that includes a transformer which is driven with a high frequency Pulse Width Modulated (PWM) signal in such a way that the constantly present PWM carrier supplies the power needed for high gate current pulses, while different voltage levels determine the "ON" or "OFF" state of the power device under control. Although transformer saturation is detected and prevented via the primary current, this circuit fails to provide feedback through the transformer itself to detect short circuits, desaturations, or collector/drain voltage.

Thus, a need exists for a low cost and reliable high power inverter that provides for reverse fault communications.

DISCLOSURE OF THE INVENTION

It is thus a general object of the present invention to provide a reliable, inexpensive isolated gate driver for high power transistor switching devices.

In carrying out the above object and other objects, features, and advantages of the present invention, an isolated gate driver device is provided. The isolated gate driver includes a primary circuit having a voltage source of a first voltage potential wherein the primary circuit constantly switches the voltage source to generate first and second load signals based on the control signals. The first load signal modulates at a first frequency for enabling the transistors and the second load signal modulates at a second frequency, different from the first frequency, for disabling the transistors. The device also includes a plurality of high frequency transformers corresponding to the power switching device having one or more transistors. Each of the transformers are in communication with the primary circuit and have a primary side and a secondary side wherein the primary side receives one of the first and second load signals and the secondary side transforms the one of the first and second load signals into corresponding signals at a second voltage potential. Still further, the device includes a secondary circuit coupled between each of the transformers and each of the corresponding transistors for providing a bias power supply to each of the transistors at the second voltage potential and for enabling and disabling each of the transistors based on the first and second load signals.

In further carrying out the above object and other objects, features, and advantages of the present invention, a method is provided for interfacing with a digital microcontroller that generates control signals and a high power switching device having a plurality of transistors floating at different potentials. The method includes the step of constantly switching a voltage source having a first voltage potential to generate first and second load signals based on the control signals, the first load signal modulating at a first frequency for enabling the transistors and the second load signal modulating at a second frequency different from the first frequency for disabling the transistors. The method also includes the steps of receiving one of the first and second load signals and transforming the one of the first and second load signals into corresponding signals at a second voltage potential. Finally, the method includes the step of performing one of enabling and disabling each of the transistors based on the first and second load signals.

The above object and other objects, features and advantages of the present invention are readily apparent from the following detailed description of the best mode for carrying out the invention when taken in connection with the accompanying drawings.

BEST MODES FOR CARRYING OUT THE INVENTION

Figure 1:
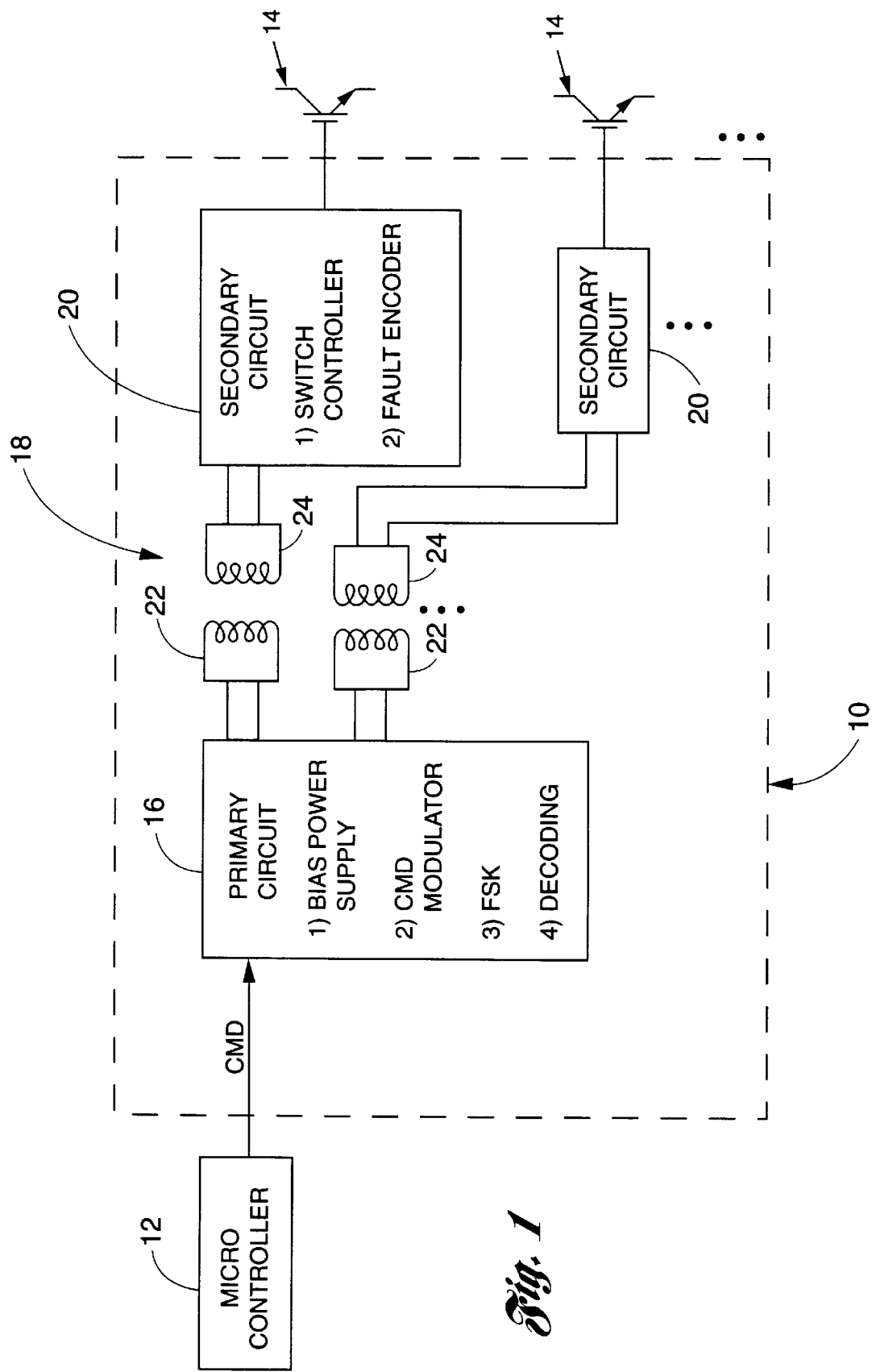
FIG. 1 is a schematic diagram of the isolated gate driver device of the present invention.

Turning now to FIG. 1, there is shown a schematic diagram of the isolated gate driver device of the present invention, denoted generally by reference numeral 10. The device 10 interfaces with an analog Pulse Width Modulated (PWM) controller or digital computer, such as a microcontroller 12, that generates control signals, CMD, and a power switching device including high power transistors 14, such as MOSFETs and IGBTs.

The device 10 includes a primary circuit 16 in communication with the microcontroller 12, a plurality of high frequency pulse transformers 18 in communication with the primary circuit, and a plurality of secondary circuits 20 each in communication with a pulse transformer 18 and a high power transistor 14. Each of the secondary circuits 20 may also be in communication with external sensors (not shown).

Primary circuit 16 provides a bias power supply to the transistors 14 as well as signal commands for each of the transistors 14 via the transformers 18. The primary circuit 16 constantly switches a voltage source of a first voltage potential to generate first and second load signals based on the control signals transmitted by microcontroller 12. The first load signal modulates at a first frequency for enabling the transistors, and the second load signal modulates at a second frequency for disabling the transistors. The first and second load signals modulate at different frequencies. The primary circuit 16 also receives fault feedback signals, decodes the same and provides status to the microcontroller 12.

The transformers 18 step up the power supply from the primary circuit 16 according to the turns ratio of the primary side 22 to the secondary side 24. Thus, transformers 18 generate the first and second load signals at a second voltage potential.

The secondary circuits 20 transfer the first and second load signals at the second voltage potential to each of the transistors 14 for providing the gate driver power to each of the transistors 14 and for enabling and disabling the transistors 14 accordingly. Furthermore, secondary circuits 20 include fault detection circuitry for detecting various faults associated with the transistors 14 and the secondary circuits 20 and transferring them to the primary circuit 16 via the transformers 18.

Figure 2:
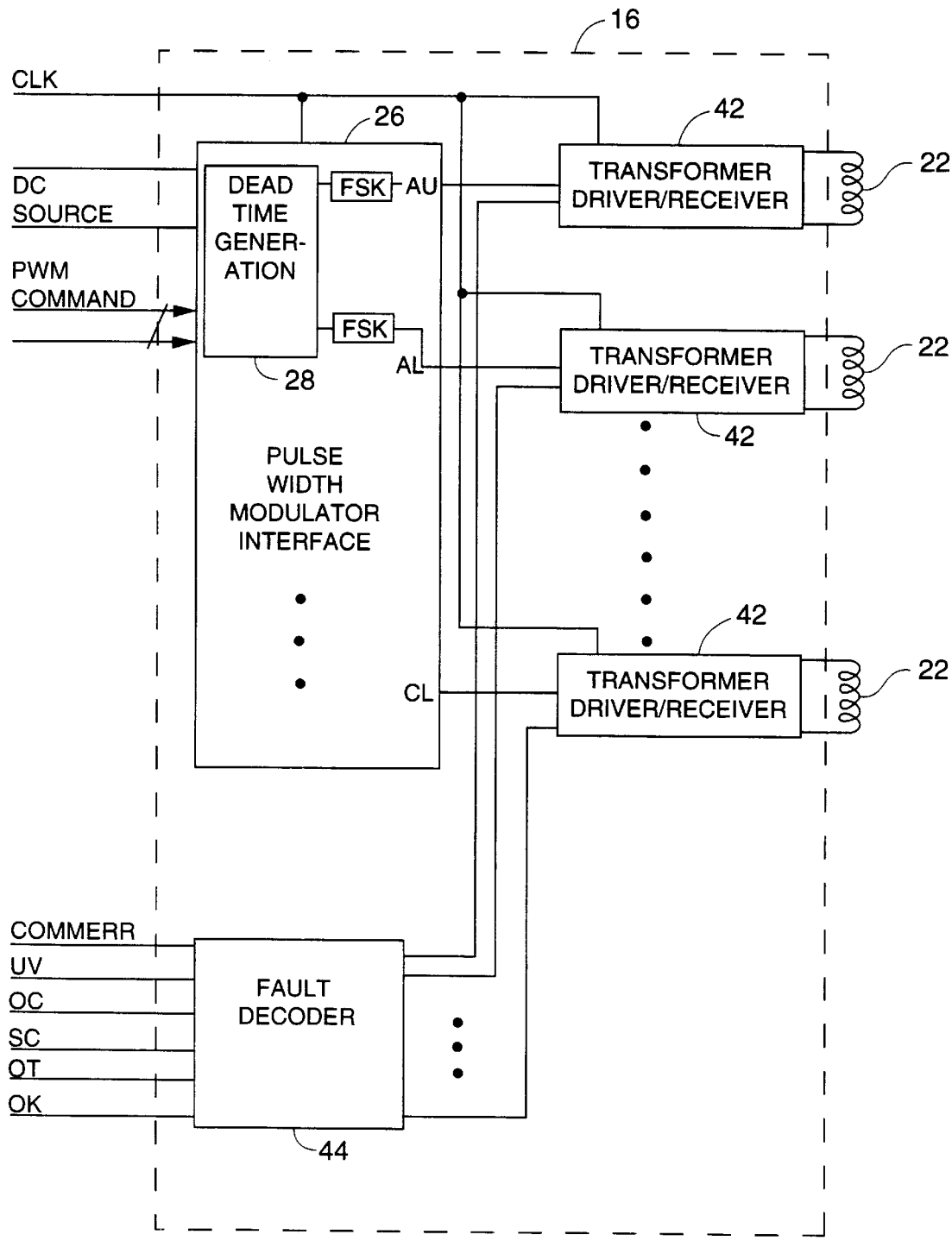
FIG. 2 is a schematic diagram of the primary circuit of the isolated gate driver device of the present invention.

FIG. 2 is a schematic diagram illustrating the primary circuit 16 in greater detail. Primary circuit 16 includes a PWM Interface 26 which receives a DC voltage source, such as 5 VDC, for providing a bias power supply to each of the transistors 14 and their circuits. PWM Interface 26 also receives PWM control/command signals generated in parallel by microcontroller 12. This is done in the interest of preserving the critical timing of PWM'd signals.

The device 16 is split, or partitioned internally, by phase leg, i.e., by pairs of the transistors 14 consisting of an upper transistor for providing a positive phase signal and a lower transistor for providing a corresponding negative phase signal. For example, a 3-Phase power inverter having six transistors 14 is grouped into three pairs of transistors 14. The Gating commands for each pair of power transistors 14 must interact to insure safe, reliable operation. Dead Time Generation circuits 28 perform this front end protection feature by preventing the simultaneous conduction of two transistors 14 paired together. This is the result of the fact that the threshold of the power device is usually not symmetrically located between the applied ON-state and OFF-state Gate drive voltages, and the transistor turn-on and turn-off delays are not usually symmetrical. Thus, without an explicit delay between commanding one of the transistors 14 OFF and the other transistor 14 ON, both transistors 14 may conduct for a short time resulting in a failure.

Dead Time Generation circuits 28 provide the following functions:

1. Ignore an input command that tries to turn both transistors 14 ON at the same time;

2. Always lock out, for a short period (defined as the "deadtime"), the turn ON of one transistor 14 whenever the other transistor 14 turns OFF; and 3. Never lock out the turn ON of a transistor 14 when it is not necessary.

Figure 3:
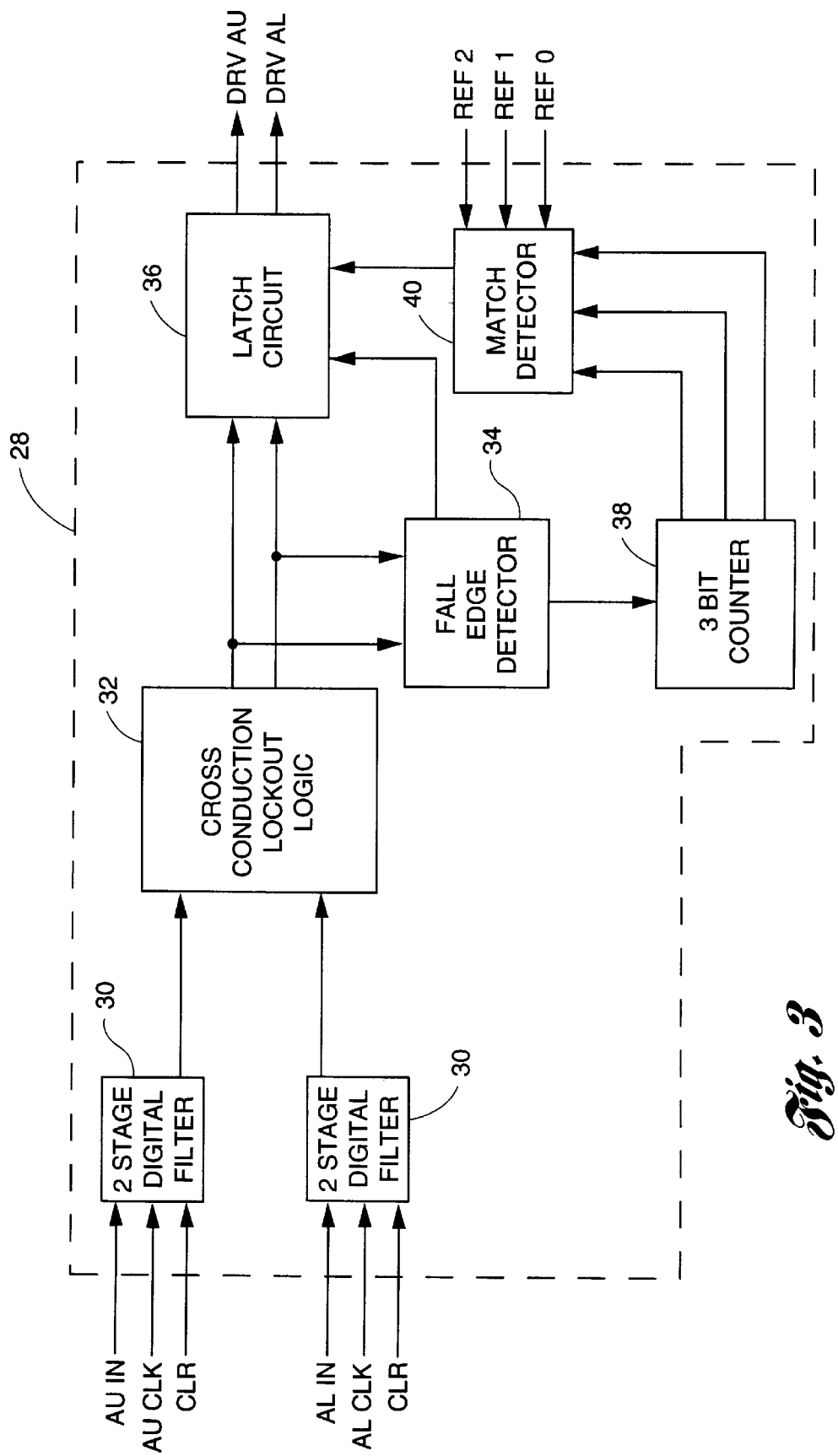
FIG. 3 is a schematic diagram of a dead time generation circuit employed in the device of the present invention.

A schematic diagram of an exemplary Dead Time Generation circuit 28 is shown in FIG. 3 for one phase leg. For the complete device 10, however, a total of three-copies of this circuit 28 would be required. The upper and lower switch commands for one phase leg, AU and AL, are first brought into the circuit 28 through 2-stage digital filters 30. This synchronizes the external commands with a system clock CLK and rejects any short term noise due to ground bounce or pickup on the command inputs.

A cross conduction lockout logic 32 treats an AUIn=ALIn=HI condition, a normally invalid command, exactly the same as an AUIn=ALIn=LO condition. This is useful for several reasons. First, some microcontrollers wake up (during RESET) with all I/O pins HI, others with all LO, and still others with all TRI-STATE. This lockout circuit 32 allows the first two conditions to occur without damage, minimizing glue logic around the device 10. The third condition must be dealt with by adding pull-ups or pull-downs on all command lines to have a known state on all inputs during power up. In addition, this behavior eliminates the possibility of a software error from damaging the device 10 by commanding cross conduction.

A falling edge detector 34 watches each input, waiting for a transistor 14 to be commanded OFF. When this happens, an SR Latch circuit 36 is set, disabling the other transistor 14. Simultaneously, a 3-bit up-counter 38 is cleared, allowing it to start counting. Counter 38 counts until it reaches a match with three externally programmed reference lines, Ref0, Ref1 and Ref2, via match detector 40. At this time, the counter 38 resets the latch 36 allowing the other transistor 14 to respond to its input command. The counter 38 also stops counting on a match to prevent recycling around to a false compare.

Figure 4:
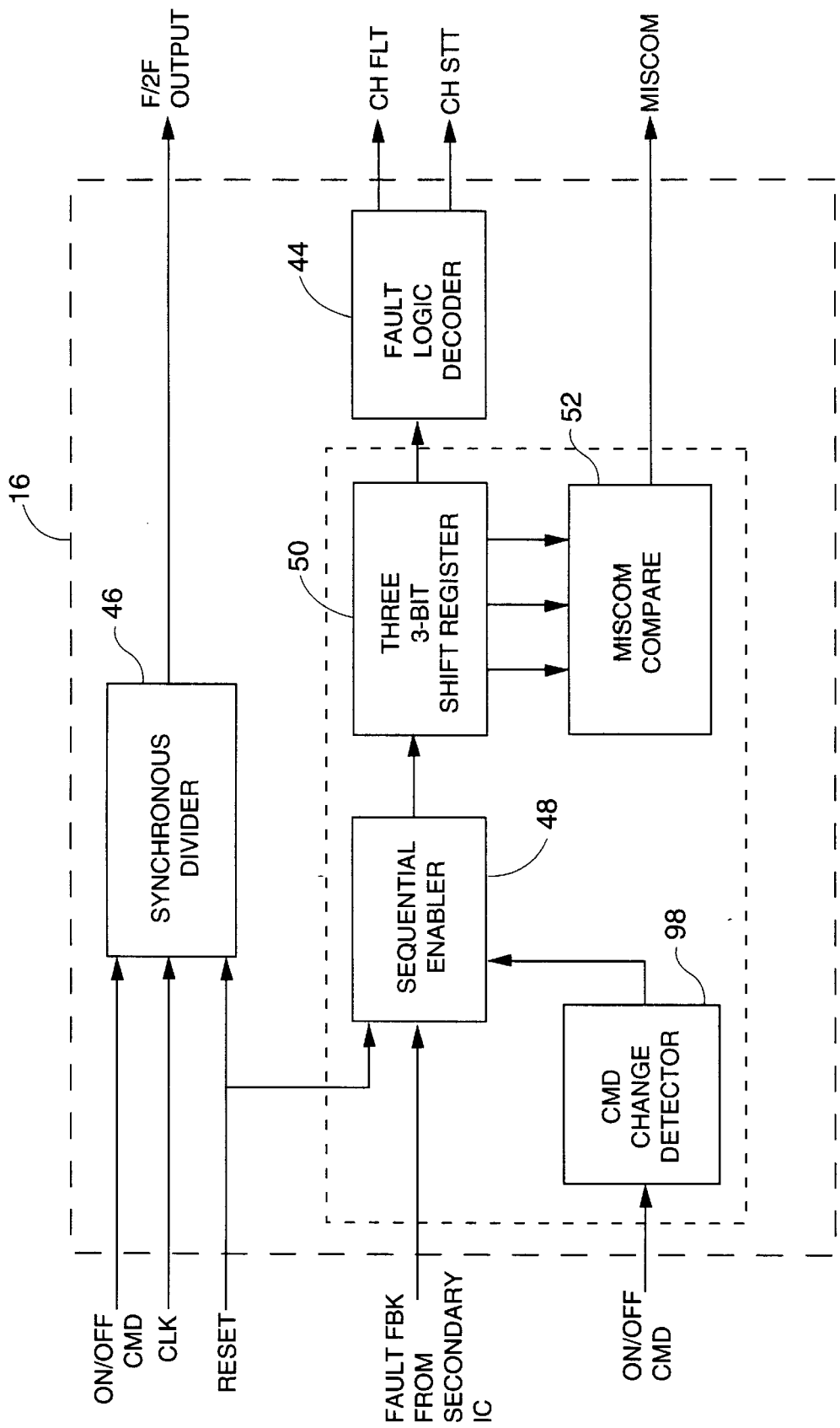
FIG. 4 is a schematic diagram of forward and reverse communications portion of the primary circuit shown in FIG. 1.

Returning now to FIG. 2, the drive signals, DrvAU and DrvAL, generated by Dead Time Generation circuit 28 are then frequency shift keyed (FSK'd) by PWM Interface 26 to transfer a command signal to a transformer driver/receiver 42 associated with each of the transformers 18. The FSK function may be accomplished utilizing a divider 46 as shown in FIG. 4 for each transistor 14. The output frequency is set equal to the input frequency, CLK, if the input, CMD, to the divider 46 is HI (or ON), while the output frequency is set equal to half the input frequency if the input to the divider 46 is LO (or OFF). That is, ON commands are modulated at a first frequency, e.g., 10 MHz, while OFF commands are modulated at a second frequency, e.g., 5 MHz.

The constant operation of the transformer 18, either at 5 MHz or 10 MHz, allows for a small and inexpensive transformer that only needs to carry the average load current (typically 20–50 mA), rather than a peak load current (typically 2–5 A). The constant operation of the transformer 18 also allows for the power supply to always be active. A further benefit of the constant operation is that the fault protection and feedback communication circuits (described in greater detail below) can operate at all times, including when the power switching transistors 14 are OFF.

The receivers 42 associated with each transformer 18 monitor the feedback paths from the secondary circuits 20 for status and fault information packets, as will be described in greater detail below, and transmit the data to a fault decoder 44. Fault decoder 44 decodes the fault information sent by secondary circuits 20 and combines them to present summary information to the microcontroller 12.

The reverse communication function of the primary circuit 16 is illustrated via an exemplary circuit shown in FIG. 4. Reverse communication from the secondary circuits 20 consists of a serial pulse stream. The first positive edge at this input triggers a sequential enabler 48 which sequentially enables three 3-bit shift registers 50. The three copies of the 3-bit encoded fault status word are stored in these registers. The three sets of data are compared in MISCOM comparator 52 and any miscompare is latched and presented as a miscommunication fault, MISCOM. If there are no miscompares, the data is passed to decoder 44 which then decodes the three sets of fault signals.

Figure 5:
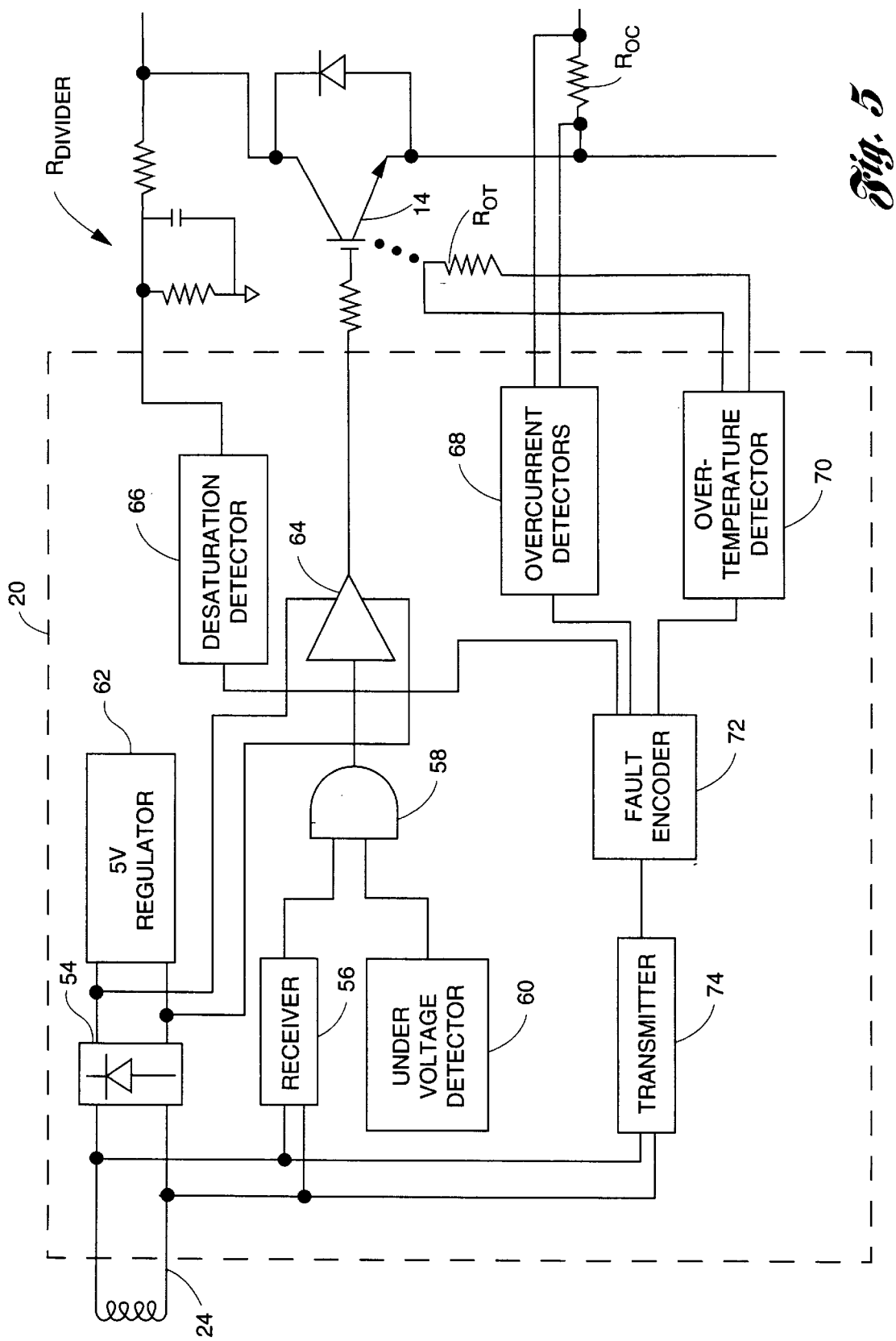
FIG. 5 is a schematic diagram of the secondary circuit of the isolated gate driver device of the present invention.

Turning now to FIG. 5, there is shown a schematic diagram of an exemplary secondary circuit 20 associated with one of the transistors 14, a total of which six are required for a 3-phase power inverter. It should be understood, however, that the present invention is not limited to separate secondary circuits 20 for each transistor 14, but may be combined into one large circuit. The power supply for the secondary circuits 20, including the supply currents for both the IC's associated with the secondary circuits 20 and the drive currents for the transistors 14, is sourced from the primary circuit 16 through isolation transformers 18.

Secondary circuit 20 includes a diode rectifying circuit for converting the AC signal on the primary side 22 of transformer 18 to a DC signal of a second voltage potential based on the first and second load signals and the turns ratio between the primary side 22 and the secondary side 24, respectively.

The AC signal from transformer secondary winding 24 is received by receiver 56 (a frequency detector), and, based on the frequency of the signal, receiver 56 determines whether it is ON or OFF. The output of receiver 56 is passed to an AND gate 58 along with an output from under voltage detector 60. Under voltage detector 60 monitors the power supply from a 5 V regulator 62 to make sure the regulator 62 is working. Under voltage detector 60 also monitors the power from the DC bias potential to transistor drive buffer 64 to make sure that transistor 14 can be properly controlled. If there is no fault with the power supply from regulator 62 and there is a signal, AND gate 58 will pass a signal to amplifier 64 for driving the transistor 14.

Secondary circuit 20 further includes circuitry for detecting various faults. For example, a desaturation detector 66 detects a short circuit in the transistor 14 by sensing the voltage at the transistor 14 via a resistive divider $R_{divider}$. Over current detector 68 detects various over current conditions via over current resistor $R_{OC}$. An over current condition may be due to one of the following: motor winding shorts, motor phase to neutral shorts, current sensor failure/degradation, and unstable current regulator. Furthermore, over temperature detector 70 detects an over temperature condition via temperature sensor $R_{OT}$.

Each of the faults are passed to a fault encoder 72 for encoding and then to transmitter 74 for modulating into a pulse stream, as will be described in greater detail below.

In a preferred embodiment, the secondary circuit 20 is split between two integrated circuits (ICs), one optimized for 30 V operating voltages that are capable of directly driving the output power transistors 14, i.e., high voltage section; and the other optimized for small feature size, fast logic functions, i.e., low voltage section. The low voltage section contains all of the forward and reverse communication logic, the fault processing and encoding, and the general housekeeping chores. The high voltage section handles the under voltage lockout and power-up protection features, the short circuit detection, and the Gate drive output buffer function.

In a second preferred embodiment, the secondary circuits 20 may be placed on a single integrated circuit, chosen as a compromise between the need for a 20–30 V circuit, such as the buffer amplifier 64, and logic circuit density/feature size with the intention of reducing overall cost by minimizing package pin count and cost.

Figure 6:
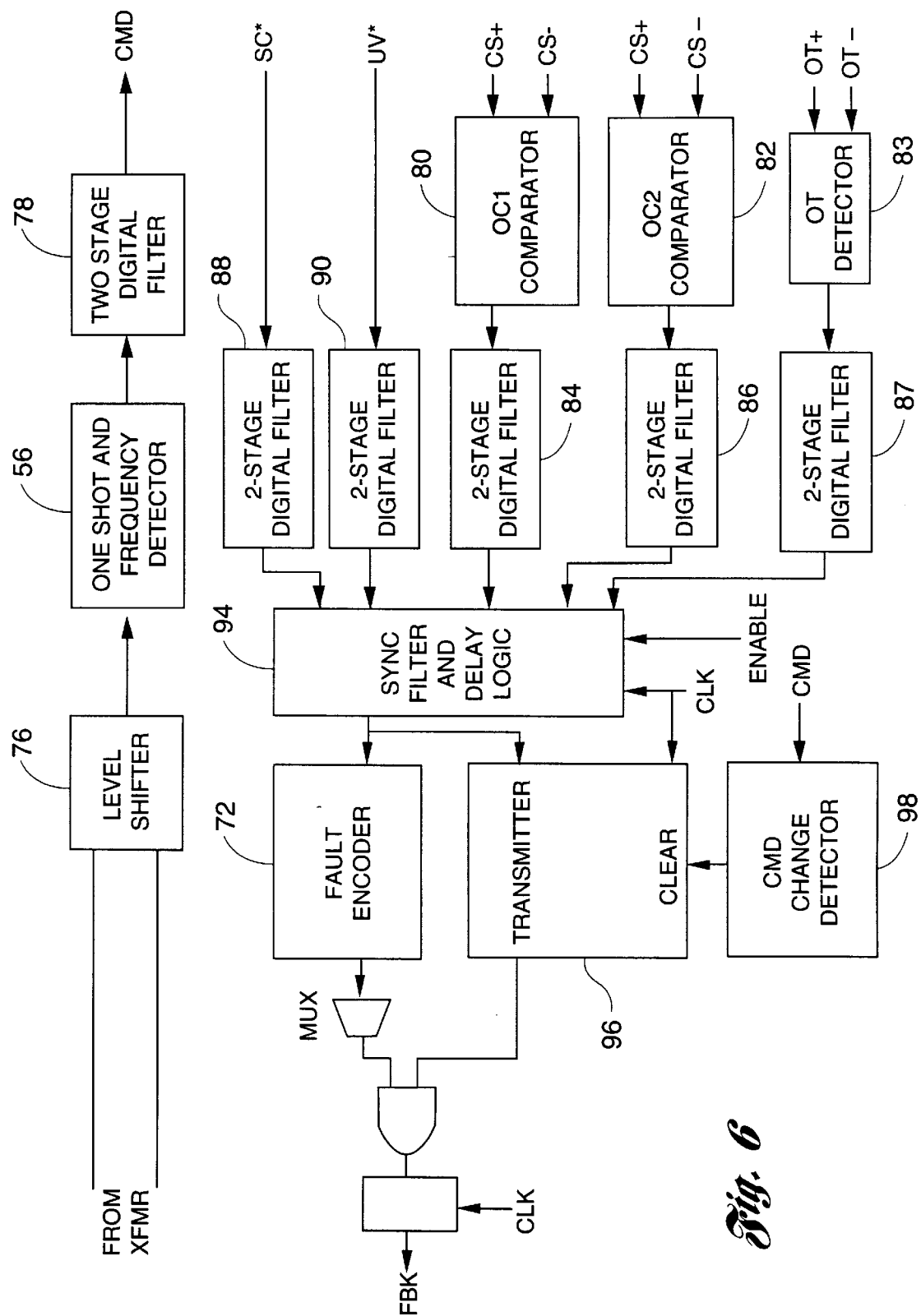
FIG. 6 is a schematic diagram of the low voltage section of the secondary circuit shown in FIG. 5.

A schematic diagram of the low voltage section of the secondary circuit 20 is shown in FIG. 6. A level shifter 76 shifts the high voltage square wave on the output terminals of the transformer 18 to a 5 VDC level clock for all internal circuits. Frequency detector (or receiver) 56 monitors the input voltage from level shifter 76. When the input frequency drops below a predetermined value, the output goes LO, indicating that the CLOCK is at the low frequency value and that CMD=OFF. This signal is latched into the first FF of a 2-stage digital filter 78, which commands the Gate driver to turn the power transistor 14 OFF. If the output of frequency detector 56 has not transitioned LO by the next rising edge of CLOCK, it must be at the high frequency value, which means that CMD=ON. This signal is then passed through filter 78 which commands the Gate driver to turn the power transistor 14 ON.

Overcurrent detection is provided at two levels. The first alerts the microcontroller 12 that currents exceeding rated values have been detected. This fault enunciates OC1, which simply transmits an OC1 error to the primary circuit 16 without taking any other action. This fault is intended to alert the microcontroller 12 that operation outside normal limits has occurred.

The second fault is designed for catastrophic error protection. It trips at a higher current, typically at twice the rated current, and enunciates OC2. This fault is transmitted to the primary circuit 16 while local circuitry latches the occurrence and shuts down the power transistor 14.

OC1 comparator 80 and OC2 comparator 82 compare their respective signals and pass their outputs to respective 2-stage digital filters 84, 86 to reduce the possibility of noise or common-mode dv/dt susceptibility from causing false overcurrent fault errors.

OT detector 83 compares the resistance of temperature sensitive resistor $R_{OT}$ to a reference value and passes an output to a 2-stage digital filter 87 describing a safe or unsafe condition.

Each of the remaining faults, short circuit (SC) and under voltage (UV) are also passed through 2-stage digital filters 88 and 92, respectively, and into a synchronous filter 94 to reduce or eliminate the chance of transient noise pickup from causing false fault indications and to eliminate the potential metastability in the digital filter output.

To reduce both the number of data bits sent over the communication path and the latency delay, the fault information from synchronous filter 94 is encoded via fault encoder 72. All five faults, undervoltage (UV), short circuit (SC), overover current (OC2), overcurrent (OC1) and over temperature (OT), are combined into a single 3-bit data word.

Because all faults are not equal, the encoder may utilize a priority network so that high priority faults take precedence over lower priority faults, and only the highest priority fault is transmitted. The priority network may be defined as:

| Priority | Code | Name | Description |
| --- | --- | --- | --- |
| Highest | 6 | UV | UnderVoltage |
|  | 5 | SC | Short Circuit |
|  | 4 | OC2 | OverOver Current |
|  | 3 | OC1 | Over Current |
|  | 2 | OT | Over Temperature |
| Lowest | 1 | OK | No fault |

Transmission of fault information from the secondary circuits 20 back to the primary circuit 16 via transformer 18 may be accomplished by one of several methods. In one embodiment, the transformer driver/receiver circuit 42 periodically stops transmitting pulses to transformer 18. Frequency detector 56 detects this inactivity and provides a separate communications trigger output. This output then triggers transmitter 96 to begin a transmission event, which sends the triplet of encoded fault information as previously defined.

During this period, driver/receiver 42 is watching for fault status feedback (since it initiated this event, it knows when to look) and receives the information as previously described. A free-running oscillator or phase locked loop (PLL) would be present in the secondary circuit 20 to maintain a clock (either synchronous or asynchronous, depending on the data encoding scheme employed) during this operation. Primary circuit 16 (driver/receiver 42) then resumes transmitting the normal carrier frequency once all bits have been received, or after a predetermined delay in the count of a miscommunication.

In an alternative embodiment, a synchronous circuit is added to secondary circuit 20 as part of the transmitter 96 so that short, synchronous "short circuits" are superimposed on the transformer secondary winding 24. Driver/receiver 42 then detects the synchronous "short circuits" by monitoring driver current draw and detecting the unique signature of their events. In this case, an independent oscillator or phase locked loop is not required on the secondary circuit 20 as the synchronous clock is always present in the signal on transformer secondary winding 24. In addition, because there is no interruption of the transmitted signal and all circuits are synchronous at all times, there is no interruption in feedback communications due to a state change in the command signal CMD.

Other methods, both synchronous and asynchronous, are possible and may be used by those skilled in the art.

During the transmission period, the inputs to the synchronous filter 94 are disabled, ignoring changes in fault status until a complete transmission of the present error is completed. Once this transmission is complete, the transmitter 96 is retriggered.

Because the primary circuit 16 must know when a transmission is about to occur, it must have some way of being triggered by the start of the transmission. This is accomplished by preceding the 3-bit encoded error signal by a single HI bit. In this way, a positive transition always starts a transmission event, and the receiver 42 (FIG. 2) can simply stand open, waiting for a transition to start it up.

In order to improve the noise immunity and confidence in fault transmission, a multiply redundant logic is preferably utilized. When a fault occurs, the encoded status word is actually transmitted three times in rapid succession. This triplet of data is fed to the three 3-bit shift registers 50 (FIG. 4) to correct any single-bit errors, and to reject indecipherable data.

Fault transmissions that coincide with a change in CMD are prone to occasional errors. To circumvent this problem, a CMD change detector 98 monitors CMD and, when a transition occurs, feedback is stopped by resetting the transmitter 96. After a predetermined amount of time, the transmitter 96 is restarted.

Figure 7:
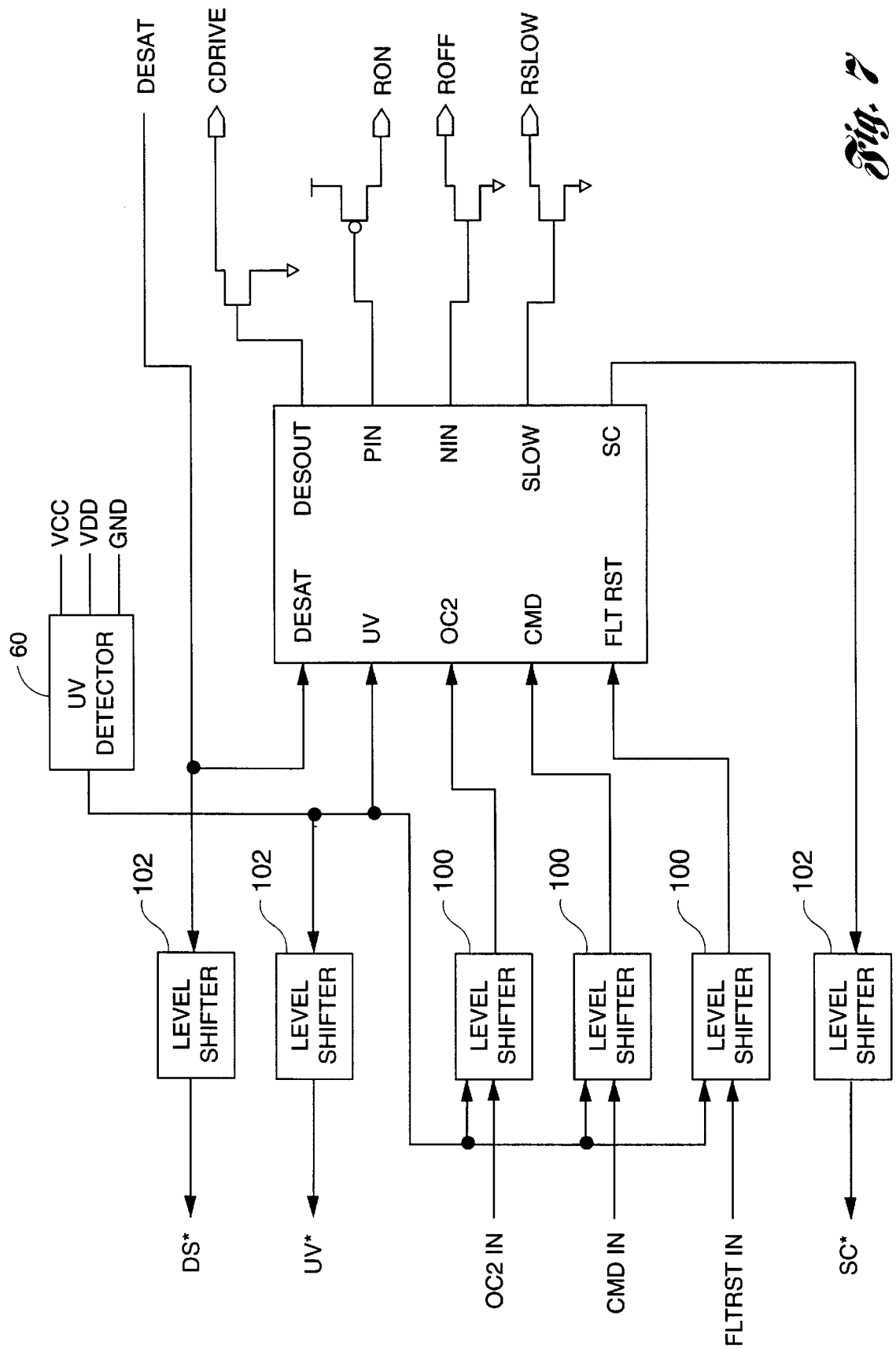
FIG. 7 is a schematic diagram of the high voltage section of the secondary circuit shown in FIG. 5.

Turning now to FIG. 7, there is shown a schematic diagram of the high voltage section of the secondary circuit 20. The low voltage circuits discussed in FIG. 6 require a 5 VDC power supply for proper operation. Coincidentally, the power transistors 14 require a −5 VDC Gate drive in the OFF state for proper noise immunity and reliable operation in modular packages. The rail to rail voltage required from the transformer 18 is then 15−(−5)=20 V (nom). Thus, low to high voltage level shifters 100 as well as high to low voltage level shifters 102 are utilized to shift the voltage levels accordingly.

Before the power supplies have come up to normal operating range, the drive and control circuits cannot be guaranteed to work properly. In particular, during power up and power down transient conditions, it is possible for false commands to be issued that could cause failure of the external power transistors 14. This effect must be eliminated by measuring the supply voltages, and ignoring all inputs until the voltages are within tolerance. The under voltage detection circuit 60 measures these voltages, compares them to predetermined reference values, and provides corresponding fault signals if necessary.

The device 10 of the present invention provides (i) input to output and high side to low side isolation; (ii) bidirectional communications to send switch commands from the microcontroller 12 and to relay status and fault information to the microcontroller 12; (iii) a circuit at the gate of each power transistor 14 to drive and protect the transistor 14; and (iv) a floating power supply to provide the bias to the driver circuits. Thus, the device 10 provides a reduction in cost, an improvement in the reliability, and a reduction in size due to its extensive protection and diagnostic capabilities.

While the best modes for carrying out the invention have been described in detail, those familiar with the art to which this invention relates will recognize various alternative designs and embodiments for practicing the invention as defined by the following claims.

What is claimed is:

1. An isolated gate driver device for interfacing with a digital microcontroller that generates control signals and a high power switching device having a plurality of transistors floating at different potentials, the device comprising:

a primary circuit having a voltage source of a first voltage potential, the primary circuit for constantly switching the voltage source to generate first and second load signals based on the control signals, the first load signal modulating at a first frequency for enabling the transistors and the second load signal modulating at a second frequency for disabling the transistors, the first frequency being different than the second frequency;

a plurality of high frequency transformers corresponding to each of the plurality of transistors, each of the transformers in communication with the primary circuit and having a primary side and a secondary side, the primary side for receiving one of the first and second load signals and the secondary side for transforming the one of the first and second load signals into corresponding signals at a second voltage potential; and a secondary circuit coupled between each of the transformers and each of the corresponding transistors for providing a bias power supply to each of the transistors at the second voltage potential and for enabling and disabling each of the transistors based on the first and second load signals.

2. The device as recited in claim 1 further comprising:

the secondary circuits for generating a fault signal in response to detecting a fault associated with any of the transistors;

the secondary side of each of the transformers for receiving the fault signal for receipt by the primary side of each of the transformers; and the primary circuit for detecting the fault signal at the primary side of each of the transformers and for generating a disabling signal in response thereto.

3. The device as recited in claim 2 wherein the secondary circuits include an encoder for encoding the fault signal into a series of pulses and wherein the primary circuit includes a decoder for decoding the series of pulses.

4. The device as recited in claim 2 wherein the power switching device includes a temperature sensor coupled to each of the transistors and wherein the secondary circuits include over temperature detection circuits coupled to each of the temperature sensors for detecting an over temperature fault associated with any of the transistors.

5. The device as recited in claim 2 wherein the secondary circuits include over current detection circuits for detecting over current faults associated with any of the transistors.

6. The device as recited in claim 2 wherein the secondary circuits include under voltage detection circuits for detecting under voltage faults associated with the secondary circuits.

7. The device as recited in claim 2 wherein the secondary circuits include short circuit detection circuits for detecting short circuits associated with any of the transistors.

8. The device as recited in claim 7 wherein the power switching device includes a resistive divider circuit coupled to each of the transistors and wherein the short circuit detection circuits are coupled to each of the resistive divider circuits.

9. The device as recited in claim 7 wherein the power switching device includes a high voltage diode coupled to each of the transistors and wherein the short circuit detection circuits are coupled to each of the high voltage diodes.

10. The device as recited in claim 1 wherein the transistors are grouped into related pairs of transistors and the device further comprising a delay circuit for delaying the generation of one of the first and second load signals after generating the other one of the first and second load signals for each of the related pairs of the transistors.

11. The device as recited in claim 1 wherein the primary circuit utilizes frequency shift keying to switch the voltage source to generate the first and second load signals.

12. A method for interfacing with a digital microcontroller that generates control signals and a high power switching device having a plurality of transistors floating at different potentials, the method comprising:
constantly switching a voltage source having a first voltage potential to generate first and second load signals based on the control signals, the first load signal modulating at a first frequency for enabling the transistors and the second load signal modulating at a second frequency different from the first frequency for disabling the transistors;
receiving one of the first and second load signals;
transforming the one of the first and second load signals into corresponding signals at a second voltage potential; and
performing one of enabling and disabling each of the transistors based on the first and second load signals.

13. The method as recited in claim 12 further comprising:
generating a fault signal in response to detecting a fault associated with any of the transistors;
transmitting the fault signal to microcontroller; and
generating a disabling signal for receipt by the transistors in response to the fault signal.

14. The method as recited in claim 13 wherein generating the fault signal includes encoding the fault signal into a series of pulses and wherein generating the disabling signal includes decoding the series of pulses.

15. The method as recited in claim 13 wherein generating the fault signal includes sensing a temperature of each of the transistors to identify an over temperature fault.

16. The method as recited in claim 13 wherein generating the fault signal includes sensing a current of each of the transistors to identify an over current fault.

17. The method as recited in claim 13 wherein generating the fault signal includes sensing a voltage of each of the transistors to identify a short circuit.

18. The method as recited in claim 12 wherein switching the voltage source includes frequency shift keying the voltage source.

* * * * *